(12) United States Patent
Liu et al.

(10) Patent No.: US 10,378,736 B2
(45) Date of Patent: Aug. 13, 2019

(54) LED BRACKET, LED BRACKET ARRAY, LED DEVICE AND LED DISPLAY SCREEN

(71) Applicant: Foshan NationStar Optoelectronics Co., Ltd., Guangdong (CN)

(72) Inventors: Chuanbiao Liu, Guangdong (CN); Feng Gu, Guangdong (CN); Yuanbin Lin, Guangdong (CN); Xiangling Luo, Guangdong (CN); Xiaofeng Liu, Guangdong (CN); Xi Zheng, Guangdong (CN); Yan Liu, Guangdong (CN)

(73) Assignee: Foshan NationStar Optoelectronics Co., Ltd., Guangdong (CN)

( * ) Notice: Subject to any disclaimer, the term of this patent is extended or adjusted under 35 U.S.C. 154(b) by 0 days.

(21) Appl. No.: 15/799,272

(22) Filed: Oct. 31, 2017

(65) Prior Publication Data

US 2018/0119928 A1     May 3, 2018

(30) Foreign Application Priority Data

Nov. 3, 2016    (CN) .................... 2016 2 1178892 U
Mar. 21, 2017    (CN) .................... 2017 2 0276852 U (51) Int. Cl.
    *H01L 23/053*     (2006.01)
    *F21V 19/00*     (2006.01)
    (Continued)

(52) U.S. Cl.
    CPC .............. *F21V 19/003* (2013.01); *F21K 9/20* (2016.08); *H01L 33/62* (2013.01); *H05K 1/036* (2013.01); *H05K 1/0346* (2013.01); *H05K 1/05* (2013.01); *H05K 1/142* (2013.01); *H05K 1/181* (2013.01); *F21Y 2115/10* (2016.08); *H01L 25/167* (2013.01); *H01L 33/52* (2013.01)

(58) Field of Classification Search
CPC .......... F21V 19/003; F21K 9/20; H01L 33/62; H05K 1/05
USPC .................................. 257/98–100, 432, 433
See application file for complete search history.

(56) References Cited

U.S. PATENT DOCUMENTS 6,383,835 B1 *   5/2002   Hata ....................... H01L 24/97
                                                                       257/433
7,768,028 B2 *   8/2010   Chang .................... H01L 33/60
                                                                         257/98

(Continued)

*Primary Examiner* — Nitin Parekh
(74) *Attorney, Agent, or Firm* — Barnes & Thornburg LLP; Jeffrey R. Stone (57) ABSTRACT

An LED bracket, LED bracket array, LED device and LED display screen are disclosed. The LED bracket includes a PCB circuit substrate and an insulating material. The PCB circuit substrate includes at least two electrically insulated electrode regions. Each electrode region includes a top electrode region, a side electrode region and a bottom electrode region. The side electrode region connects the top electrode region and the bottom electrode region into an integrated structure. The side electrode region is a side surface sunk from outside to an inner part of the PCB circuit substrate. The insulating material is filled in the side electrode region. An upper end surface and a lower end surface of the insulating material do not exceed an upper surface and a lower surface of the PCB circuit substrate. A thickness of the insulating material is less than a thickness of the PCB circuit substrate.

13 Claims, 10 Drawing Sheets

(51) Int. Cl.
*F21K 9/20* (2016.01)
*H05K 1/03* (2006.01)
*H05K 1/05* (2006.01)
*H05K 1/14* (2006.01)
*H05K 1/18* (2006.01)
*H01L 33/62* (2010.01)
*F21Y 115/10* (2016.01)
*H01L 25/16* (2006.01)
*H01L 33/52* (2010.01)

(56) References Cited

U.S. PATENT DOCUMENTS

| | | | | |
|---|---|---|---|---|
| 8,026,533 B2* | 9/2011 | Noichi | | H01L 25/167 |
| | | | | 257/100 |
| 8,530,925 B2* | 9/2013 | Kim | | H01L 33/60 |
| | | | | 257/433 |
| 8,592,855 B2* | 11/2013 | Kim | | H01L 33/486 |
| | | | | 257/433 |
| 8,809,896 B2* | 8/2014 | Kurimoto | | G09F 9/33 |
| | | | | 257/99 |
| 8,890,295 B2* | 11/2014 | Okabe | | H01L 33/38 |
| | | | | 257/675 |
| 2003/0189830 A1* | 10/2003 | Sugimoto | | H01L 25/0753 |
| | | | | 362/294 |
| 2006/0267042 A1* | 11/2006 | Izuno | | H01L 21/76251 |
| | | | | 257/100 |
| 2009/0050925 A1* | 2/2009 | Kuramoto | | H01L 33/486 |
| | | | | 257/100 |
| 2010/0059782 A1* | 3/2010 | Fujitomo | | H01L 33/62 |
| | | | | 257/98 |
| 2011/0127566 A1* | 6/2011 | Yoon | | H01L 33/486 |
| | | | | 257/99 |
| 2015/0023016 A1* | 1/2015 | Ishihara | | H05K 3/284 |
| | | | | 362/241 |
| 2015/0034986 A1* | 2/2015 | Lee | | H01L 27/15 |
| | | | | 257/98 |

* cited by examiner

LED BRACKET, LED BRACKET ARRAY, LED DEVICE AND LED DISPLAY SCREEN

CROSS-REFERENCES TO RELATED APPLICATIONS

This application claims priority to Chinese patent application No. 201621178892.5, filed on Nov. 3, 2016 and Chinese patent application No. 201720276852.2, filed on Mar. 21, 2017, the disclosures of which are incorporated herein by reference in their entirety.

TECHNICAL FIELD

The present disclosure relates to the field of light emitting diode (LED) technology, and particularly relates to an LED bracket, an LED bracket array, an LED device and an LED display screen.

BACKGROUND

A manufacturing technology of a chip LED device generally includes procedures of manufacturing a circuit board, die bonding, wire bonding, encapsulating, scribing, testing, taping, and the like.

Figure 1:
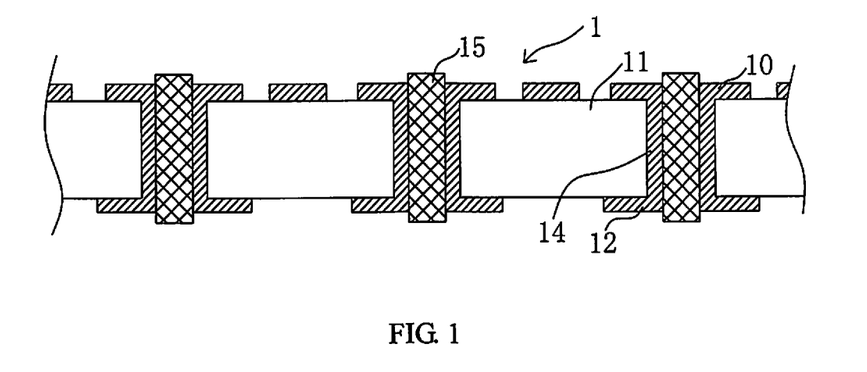
FIG. 1 is a side-viewing diagram illustrating a structure of an LED bracket obtained by an existing manufacturing technology of a chip LED device.

With reference to FIG. 1, which is a side-viewing diagram illustrating a structure of a circuit board 1 obtained by an existing manufacturing technology of a chip LED device. The circuit board 1 is formed by combining top layer copper 10, middle layer BT material 11 and bottom layer copper 12. In the process of manufacturing the circuit board 1, to realize electrical connection between the top layer copper 10 and the bottom layer copper 12, a via hole needs to be drilled in the circuit board 1 and copper 14 is plated on an inner wall of the via hole, and then the top layer copper 10 and the bottom layer copper 12 can be connected by the copper 14 plated on the inner wall of the via hole. In the process of encapsulating, the circuit board 1 generally is covered by an encapsulation adhesive in a manner of molding, and an encapsulation adhesive layer is formed to seal and protect an installed chip on the circuit board 1. However, since uncured encapsulation adhesive may flow out downwards along the via hole in the process of encapsulating, the via hole needs to be completely plugged firstly by resin 15 in the previous process of manufacturing the circuit board. A thickness of the resin 15 plugged in the via hole is often slightly larger than a depth of the via hole, and both ends of the resin 15 protrude from the via hole.

Figure 2:
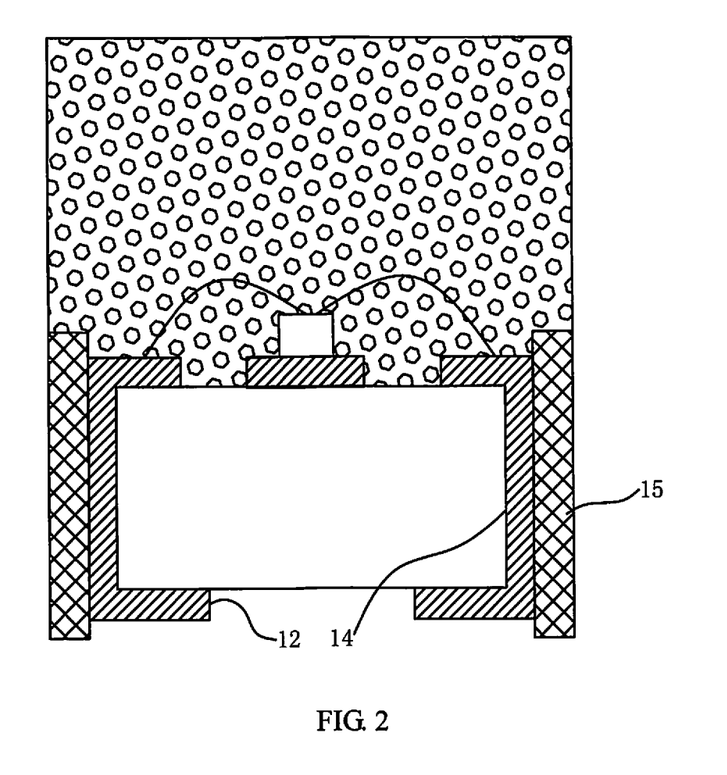
FIG. 2 is a side-viewing diagram illustrating a structure of an existing chip LED device.
Figure 3:
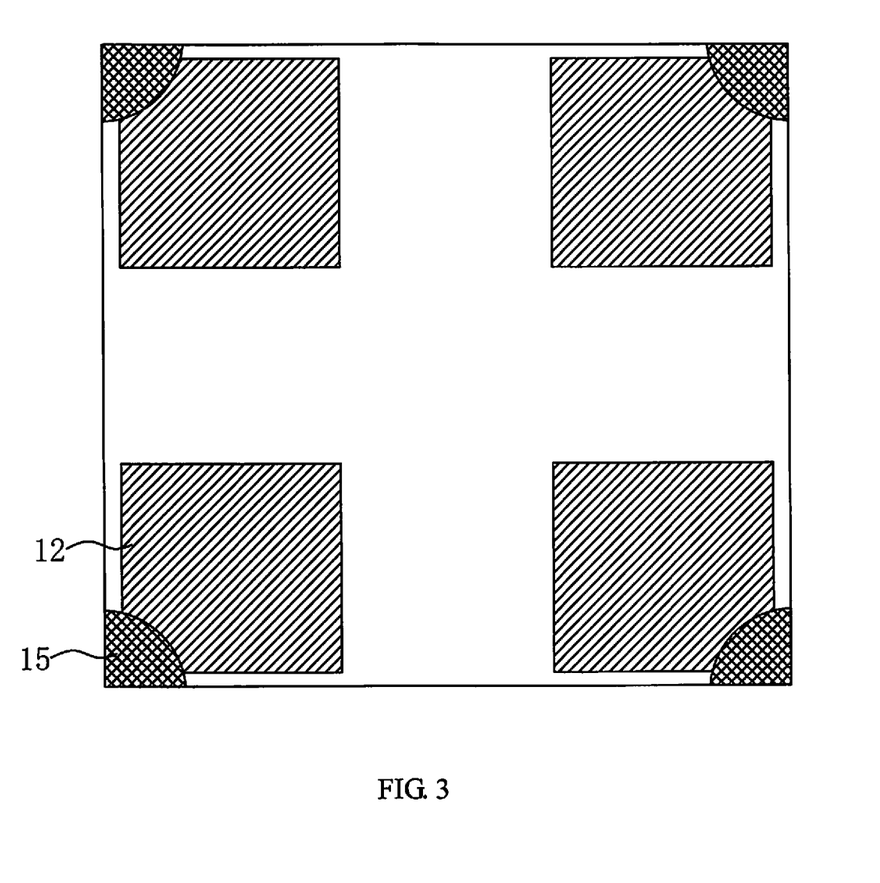
FIG. 3 is a bottom-viewing diagram illustrating a structure of an existing chip LED device.

FIG. 2 is a side-viewing diagram illustrating a structure of an existing chip LED device. FIG. 3 is a rear-viewing diagram illustrating an existing chip LED device. With reference to FIG. 2 and FIG. 3, the chip LED device formed after the process of dicing still has the resin 15 in the via hole of the circuit board 1. Since a lower end of the resin 15 is beyond a lower surface of the bottom layer copper 12 and a thickness of the copper 14 is generally only 10 µm, the lower end of the resin 15 is easy to be collided by an external force in subsequent processes of testing and taping, so that a combination part between the resin 15 and the copper 14 is broken, which may result in drop out of the bottom layer copper 12 that serves as a bottom electrode of the chip LED device and cause product damage. In addition, the resin 15 may also cause a problem of poor contact of the bottom electrode of the LED device, thereby resulting in misjudgment of a testing result, reducing production efficiency and influencing a usage of patches of the LED device.

SUMMARY

One or more embodiments of the present invention provide an LED bracket, an LED bracket array, an LED device and an LED display screen, to solve the above-mentioned problems.

In a first aspect, an embodiment of the present invention provides an LED bracket, including a Printed Circuit Board (PCB) circuit substrate and an insulating material, wherein the PCB circuit substrate comprises at least two electrode regions electrically insulated from each other; each of the at least two electrode regions comprises a top electrode region, a side electrode region and a bottom electrode region; the top electrode region and the bottom electrode region are connected into an integrated structure by the side electrode region; the side electrode region is a side surface sunk from outside to an interior of the PCB circuit substrate; the insulating material is filled in the side electrode region; an upper end surface and a lower end surface of the insulating material do not exceeded an upper surface and a lower surface of the PCB circuit substrate, and a thickness h of the insulating material is less than a thickness H of the PCB circuit substrate.

In a second aspect, an embodiment of the present invention further provides an LED bracket array, including a plurality of LED brackets. The LED bracket is an LED bracket disclosed according to the first aspect.

In a third aspect, an embodiment of the present invention further provides an LED device, including an LED bracket, an LED chip, one or more bonding wires and, an encapsulation adhesive layer. The LED bracket is an LED bracket disclosed according to the first aspect. The LED chip is welded on a wire bonding region of the PCB circuit substrate of the LED bracket through the bonding wire. The encapsulation adhesive layer covers the LED chip and the bonding wire.

An embodiment of the present invention further provides an LED display screen, including a PCB circuit substrate and a plurality of LED devices installed on the PCB circuit substrate. The LED device is an LED device disclosed according to the third aspect.

| | | |
|---|---|---|
| 1: circuit board; | 10: top layer copper; | 11: middle layer BT material; |
| 12: bottom layer copper; | 14: copper; | 15: resin; |
| 2: LED bracket; | 20: PCB circuit substrate; | 21: insulating material; |
| 201: top electrode region; | 202: side electrode region; | 203: bottom electrode region; |
| 2011: first gold layer; | 2012: first nickel layer; | 2013: first copper layer; |
| 2014: first silver layer; | 2015: first palladium layer; | 2021: second gold layer; |
| 2022: second nickel layer; | 2023: second copper layer; | 2024: second silver layer; |
| 2025: second palladium layer; | 2031: third gold layer; | 2032: third nickel layer; |
| 2033: third copper layer; | 2034: third silver layer; | 2035: third palladium layer; |
| 3: LED bracket array; | 30: via hole; | |
| 4: LED device; | 40: encapsulation adhesive layer; | |
| 41: LED chip; | 411: red-light LED chip; | 412: green-light LED chip; |
| 413: blue-light LED chip; | 45: bonding wire; | 451: straight part; |
| 452: curve part. | | |

DETAILED DESCRIPTION

In illustration of embodiments of the present invention, unless otherwise explicitly regulated and defined, terms such as "contact", "connect" and "fix" shall be understood in broad sense, and for example, may refer to fixed connection or detachable connection or integral connection, may refer to mechanical connection or electrical connection and may refer to direct connection or indirect connection through an intermediate medium or inner communication of two elements or interaction of two elements. For those ordinary skilled in the art, specific meanings of the above terms in embodiments of the present invention may be understood according to specific conditions.

In embodiments of the present invention, unless otherwise explicitly specified and defined, a condition that a first feature is "above" or "below" a second feature may include direct contact between the first feature and the second feature, and may also include contact through additional features between the first feature and the second feature rather than direct contact between the first feature and the second feature. Moreover, a condition that the first feature is "above", "on top of" and "on the surface of" the second feature may include that the first feature is directly over and above the second feature, or only indicates that a horizontal height of the first feature is higher than that of the second feature. A condition that the first feature is "below", "under" and "at the bottom of" the second feature may include that the first feature is directly under and below the second feature, or only indicates that a horizontal height of the first feature is smaller than that of the second feature.

Figure 4:
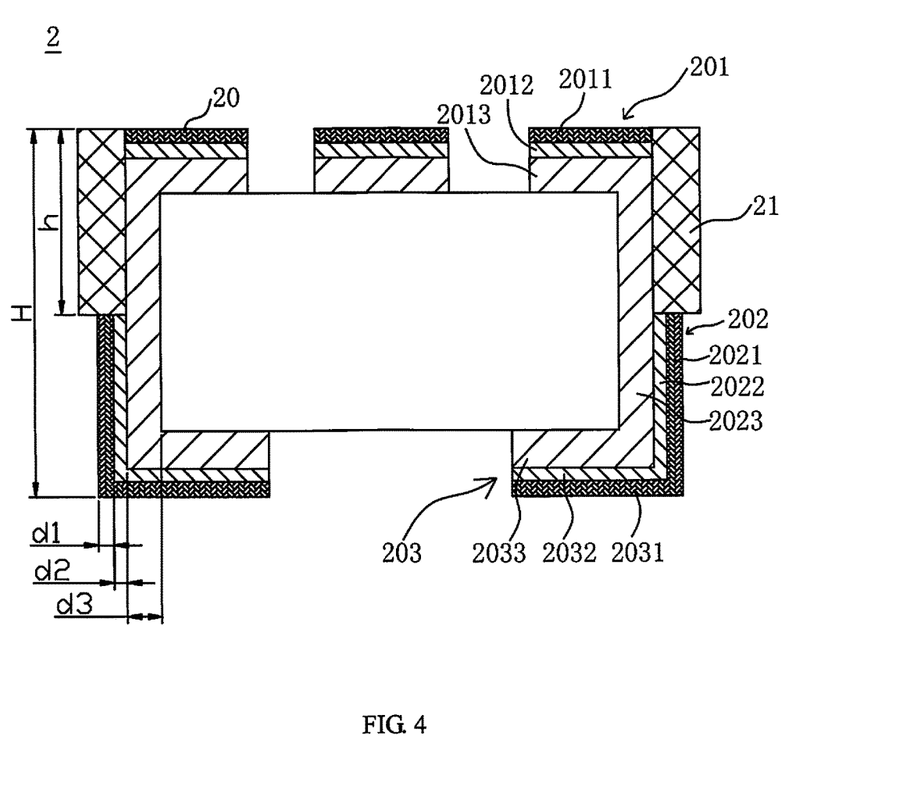
FIG. 4 is a side-viewing diagram illustrating an LED bracket in an embodiment of the present invention.
Figure 5:
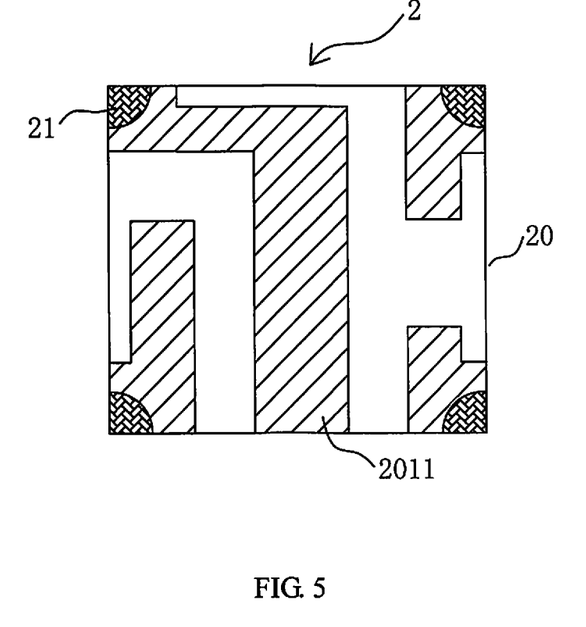
FIG. 5 is a top-viewing diagram illustrating an LED bracket in an embodiment of the present invention.
Figure 6:
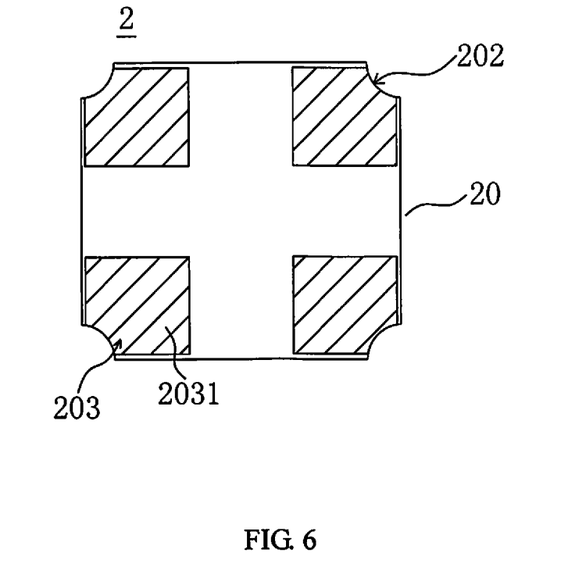
FIG. 6 is a bottom-viewing diagram illustrating an LED bracket in an embodiment of the present invention.

FIG. 4 is a side-viewing diagram illustrating an LED bracket in an embodiment of the present invention. FIG. 5 is a top-viewing diagram illustrating an LED bracket in an embodiment of the present invention. FIG. 6 is a bottom-viewing diagram illustrating an LED bracket in an embodiment of the present invention. With reference to FIG. 4 to FIG. 6, an LED bracket 2 provided in embodiments of the present invention includes a Printed Circuit Board (PCB) circuit substrate 20 and an insulating material 21. The PCB circuit substrate 20 includes at least two electrode regions electrically insulated from each other. Each of the electrode regions includes a top electrode region 201, a side electrode region 202 and a bottom electrode region 203. The side electrode region 202 connects the top electrode region 201 and the bottom electrode region 203 into an integrated structure to realize electrical connection. The side electrode region 202 is a side surface sunk from outside to an inner part of the PCB circuit substrate 20. The insulating material 21 is filled in the side electrode region 202. An upper end surface and a lower end surface of the insulating material 21 do not exceed an upper surface and a lower surface of the PCB circuit substrate 20 respectively. A thickness h of the insulating material 21 is less than a thickness H of the PCB circuit substrate 20.

By arranging that the upper end surface and the lower end surface of the insulating material 21 filled in the LED bracket 2 do not exceed the upper surface and the lower surface of the PCB circuit substrate 20, it can be reduced to a possibility that the insulating material 21 may be collided by an external force in processes of die bonding, wire bonding, testing, taping, and the like, it can be avoided poor operation or damage of production devices such as a curdling head, a wire bonding porcelain mouth and the like due to collision; and meanwhile, it can be prevented from a problem of poor contact when testing, thereby ensuring accuracy of a test result, further increasing a product qualification ratio and production efficiency for manufacturing the LED device and benefiting the usage of patches of the LED device.

In the present embodiment, as shown in FIG. 5 and FIG. 6, the PCB circuit substrate 20 of the LED bracket 2 is a quadrangle. The PCB circuit substrate 20 includes four electrically insulated electrode regions. The side electrode region 202 of each electrode region is a ¼ cylindrical side surface sunk from outside to the inner part of the PCB circuit substrate 20.

The top electrode region 201, the side electrode region 202 and the bottom electrode region 203 are respectively provided with metal layers, and the metal layer of the top electrode region 201, the metal layer of the side electrode region 202 and the metal layer of the bottom electrode region 203 are connected into an integrated structure.

In examples of the present invention, a first gold layer 2011, a first nickel layer 2012 and a first copper layer 2013 are plated on the top electrode region 201 of each electrode region from top to bottom. A second gold layer 2021, a second nickel layer 2022 and a second copper layer 2023 are plated on the side electrode region 202 of each electrode region from outside to the PCB circuit substrate 20. A third gold layer 2031, a third nickel layer 2032 and a third copper layer 2033 are plated on the bottom electrode region 203 of each electrode region from bottom to top. In each electrode region, the first copper layer 2013 of the top electrode region 201, the second copper layer 2023 of the side electrode region 202 and the third copper layer 2033 of the bottom electrode region 203 are connected into an integrated structure. The second gold layer 2021 of the side electrode region 202 and the third gold layer 2031 of the bottom electrode region 203 are connected into an integrated structure; and the second nickel layer 2022 of the side electrode region 202 and the third nickel layer 2032 of the bottom electrode region 203 are connected into an integrated structure.

By arranging the copper layers, the nickel layers and the gold layers on the electrode regions, electrical conductivity of the LED bracket 2 can be enhanced, so that the side electrode region 202 and the bottom electrode region 203 are combined not only through the copper layers, but also through the nickel layers and the gold layers, thereby enhancing a combination force of the side electrode region 202 and the bottom electrode region 203, preventing combination parts from breaking, and further enhancing reliability of the LED bracket 2.

In other embodiments of the present invention, the first copper layer 2013 of the top electrode region 201, the second copper layer 2023 of the side electrode region 202 and the third copper layer 2033 of the bottom electrode region 203 are connected into an integrated structure; the second gold layer 2021 of the side electrode region 202 and the first gold layer 2011 of the top electrode region 201 are connected into an integrated structure; and the second nickel layer 2022 of the side electrode region 202 and the first nickel layer 2012 of the top electrode region 201 are connected into an integrated structure.

In some embodiments of the present invention, a thickness d3 of the second copper layer 2023 of the side electrode region 202 of each electrode region is greater than or equal to 10 µm; a thickness d2 of the second nickel layer 2022 is greater than or equal to 2.5 µm; and a thickness d1 of the second gold layer 2021 is greater than or equal to 0.1 µm. By arranging the thickness of the copper layer, the thickness of the nickel layer and the thickness of the gold layer of the side electrode region 202, sufficient combination force is ensured between the side electrode region 202 and the bottom electrode region 203, the consumptions of copper, nickel and gold are reduced and production cost is reduced.

Figure 7:
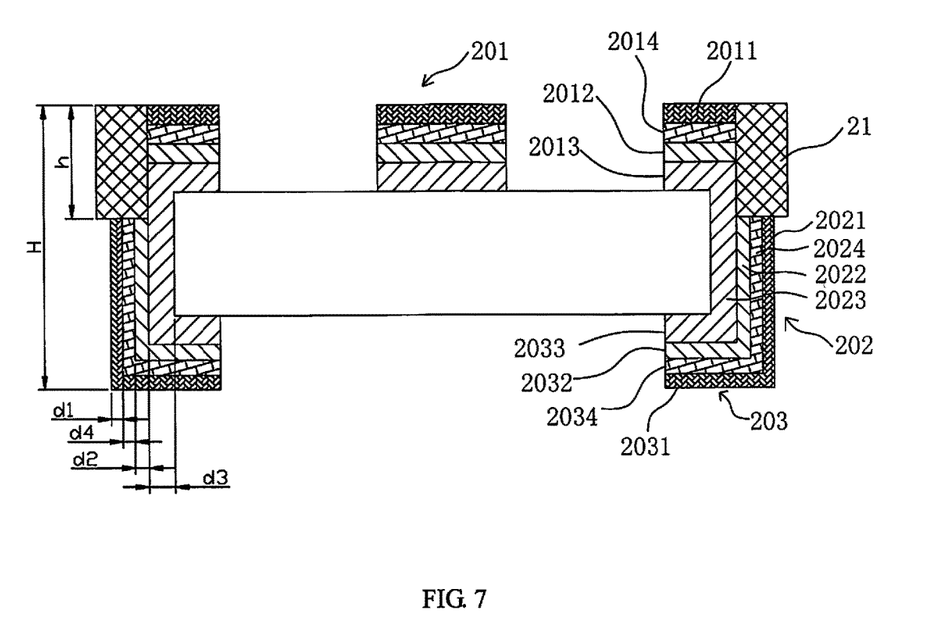
FIG. 7 is a side-viewing diagram illustrating another LED bracket in an embodiment of the present invention.

FIG. 7 is a side-viewing diagram illustrating another LED bracket in an embodiment of the present invention. With reference to FIG. 7, in some embodiments of the present invention, a first gold layer 2011, a first silver layer 2014, a first nickel layer 2012 and a first copper layer 2013 are arranged on the top electrode region 201 from top to bottom. A second gold layer 2021, a second silver layer 2024, a second nickel layer 2022 and a second copper layer 2023 are arranged on the side electrode region 202 from outside to the PCB circuit substrate 20. A third gold layer 2031, a third silver layer 2034, a third nickel layer 2032 and a third copper layer 2033 are arranged on the bottom electrode region 203 from bottom to top. In each electrode region, the first copper layer 2013 of the top electrode region, the second copper layer 2023 of the side electrode region 202 and the third copper layer 2033 of the bottom electrode region 203 are connected into an integrated structure; the second gold layer 2021 of the side electrode region 202 and the third gold layer 2031 of the bottom electrode region 203 are connected into an integrated structure; the second silver layer 2024 of the side electrode region 202 and the third silver layer 2034 of the bottom electrode region 203 are connected into an integrated structure; and the second nickel layer 2022 of the side electrode region 202 and the third nickel layer 2032 of the bottom electrode region 203 are connected into an integrated structure.

In other embodiments of the present invention, in each electrode region, the first copper layer 2013 of the top electrode region, the second copper layer 2023 of the side electrode region 202 and the third copper layer 2033 of the bottom electrode region 203 are connected into an integrated structure; the second gold layer 2021 of the side electrode region 202 and the first gold layer 2011 of the top electrode region 201 are connected into an integrated structure; the second silver layer 2024 of the side electrode region 202 and the first silver layer 2014 of the top electrode region 201 are connected into an integrated structure; and the second nickel layer 2022 of the side electrode region 202 and the first nickel layer 2012 of the top electrode region 201 are connected into an integrated structure.

In some embodiments of the present invention, a thickness d3 of the second copper layer 2023 of the side electrode region 202 is greater than or equal to 10 µm; a thickness d2 of the second nickel layer 2022 is greater than or equal to 2.5 µm; a thickness d4 of the second silver layer 2024 is greater than or equal to 0.25 µm; and a thickness d1 of the second gold layer 2021 is greater than or equal to 0.1 µm.

Figure 8:
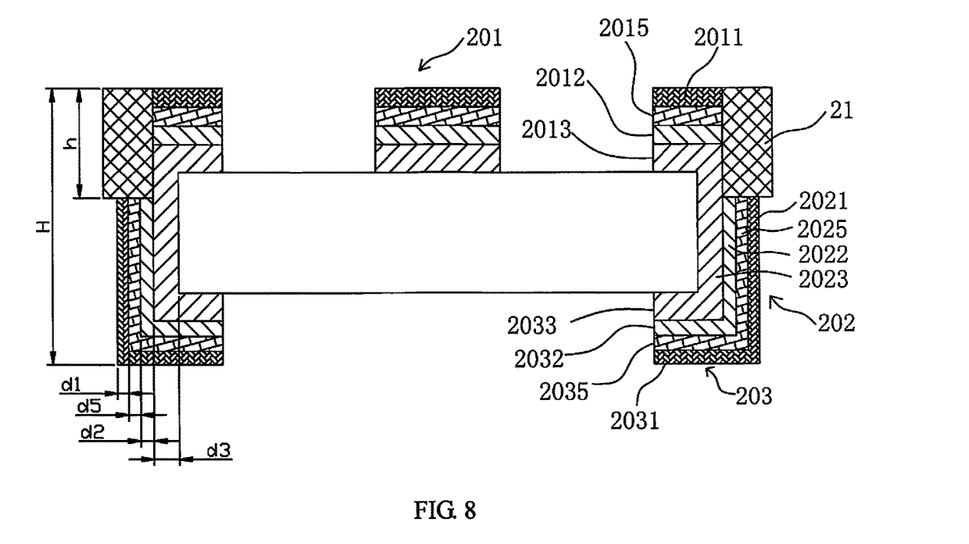
FIG. 8 is a side-viewing diagram illustrating another LED bracket in an embodiment of the present invention.

FIG. 8 is a side-viewing diagram illustrating another LED bracket in an embodiment of the present invention. With reference to FIG. 8, in some other examples of the present invention, a first gold layer 2011, a first palladium layer 2015, a first nickel layer 2012 and a first copper layer 2013 are arranged on the top electrode region 201 from top to bottom. A second gold layer 2021, a second palladium layer 2025, a second nickel layer 2022 and a second copper layer 2023 are arranged on the side electrode region 202 from outside to the PCB circuit substrate 20. A third gold layer 2031, a third palladium layer 2035, a third nickel layer 2032 and a third copper layer 2033 are arranged on the bottom electrode region 203 from bottom to top. In each electrode region, the first copper layer 2013 of the top electrode region 201, the second copper layer 2023 of the side electrode region 202 and the third copper layer 2033 of the bottom electrode region 203 are connected into an integrated structure; the second gold layer 2021 of the side electrode region 202 and the third gold layer 2031 of the bottom electrode region 203 are connected into an integrated structure; the second palladium layer 2025 of the side electrode region 202 and the third palladium layer 2035 of the bottom electrode region 203 are connected into an integrated structure; and the second nickel layer 2022 of the side electrode region 202 and the third nickel layer 2032 of the bottom electrode region 203 are connected into an integrated structure.

In other embodiments of the present invention, in each electrode region, the first copper layer 2013 of the top electrode region 201, the second copper layer 2023 of the side electrode region 202 and the third copper layer 2033 of the bottom electrode region 203 are connected into an integrated structure; the second gold layer 2021 of the side electrode region 202 and the first gold layer 2011 of the top electrode region 201 are connected into an integrated structure; the second palladium layer 2025 of the side electrode region 202 and the first palladium layer 2015 of the top electrode region 201 are connected into an integrated structure; and the second nickel layer 2022 of the side electrode region 202 and the first nickel layer 2012 of the top electrode region 201 are connected into an integrated structure.

In some embodiments of the present invention, a thickness d3 of the second copper layer 2023 of the side electrode region 202 is greater than or equal to 10 μm; a thickness d2 of the second nickel layer 2022 is greater than or equal to 2.5 μm; a thickness d5 of the second palladium layer 2025 is greater than or equal to 0.1 μm; and a thickness d1 of the second gold layer 2021 is greater than or equal to 0.1 μm.

The insulating material 21 is resin or green oil. The green oil is an acrylic oligomer frequently used in PCB industry. The thickness h of the insulating material 21 filled in the side electrode region 202 of each electrode region and the thickness H of the PCB circuit substrate 20 satisfy a relational expression:

$$\frac{1}{2}H \le h \le \frac{2}{3}H.$$

An upper end surface of the insulating material 21 filled in the side electrode region 202 of each electrode region is level with an upper surface of the PCB circuit substrate 20. A part of the side electrode region 202 filled with the insulating material 21 is only provided with the second copper layer 2023, and is not provided with the second gold layer 2021, the second nickel layer 2022, the second silver layer 2024 or the second palladium layer 2025. A part of the side electrode region 202 not filled with the insulating material 21 is provided with the second gold layer 2021, the second nickel layer 2022, the second silver layer 2024 or the second palladium layer 2025. Roles of arranging the metal layers are to protect the second copper layer 2023 of the side electrode region 202 from separating from the substrate and to increase tinning area. In other embodiments, the upper end surface of the insulating material 21 filled in the side electrode region 202 of each electrode region is lower than the upper surface of the PCB circuit substrate 20, and a lower end surface of the insulating material 21 is higher than a lower surface of the PCB circuit substrate 20. Namely, the upper end surface and the lower end surface of the insulating material 21 are defined between the upper surface and the lower surface of the PCB circuit substrate 20. This filling mode has the advantages that the combination force of epoxy resin and the substrate is enhanced when the device is encapsulated subsequently, and then bottom tinning area can also be increased. The metal layers described in embodiments of the present invention are not limited to gold, silver, palladium, nickel, copper and combinations thereof, and can also adopt other metal materials or alloy materials, such as iron.

By configuring the position and the thickness of the insulating material 21, more space of the side electrode region 202 is reserved to plate metal while preventing encapsulation adhesive from flowing out along the via hole, thereby realizing mutual connection of the side electrode region 202 and the bottom electrode region 203 that serves as the bottom electrode, enhancing the combination force of the side electrode region 202 and the bottom electrode region 203 and reducing the consumption of the insulating material 21.

In some embodiments of the present invention, the LED bracket 2 also has a variety of variants. For example, the PCB circuit substrate 20 may be in the shapes of a square, a parallelogram, a regular hexagon or a regular triangle and the like. The PCB circuit substrate 20 may have two, three, five or more electrode regions.

Figure 9:
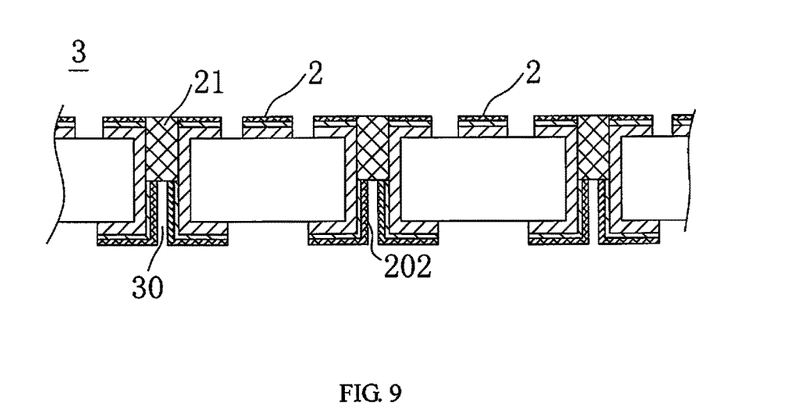
FIG. 9 is a side-viewing diagram illustrating an LED bracket array in an embodiment of the present invention.
Figure 10:
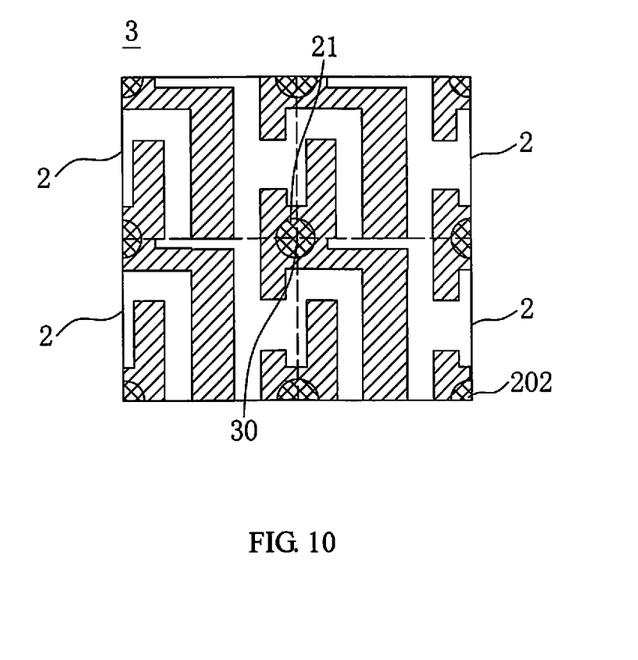
FIG. 10 is a top-viewing partial structural diagram illustrating an LED bracket array in an embodiment of the present invention.
Figure 11:
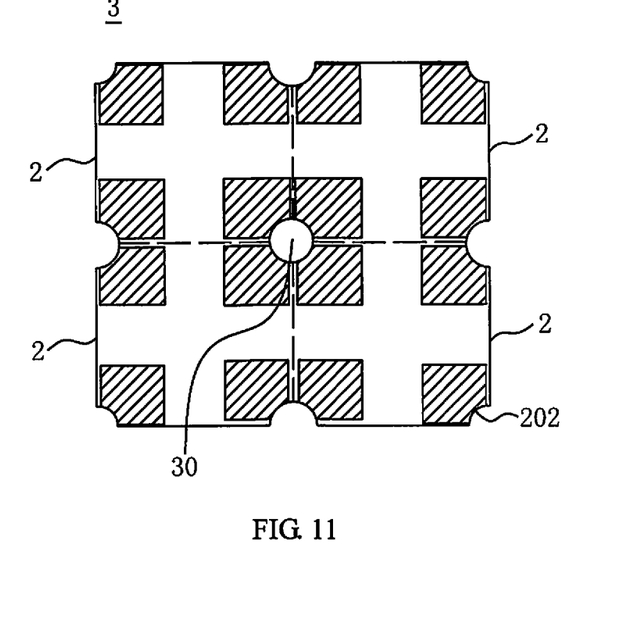
FIG. 11 is a bottom-viewing partial structural diagram illustrating an LED bracket array in an embodiment of the present invention.

FIG. 9 is a side-viewing diagram illustrating an LED bracket array in an embodiment of the present invention. FIG. 10 is a top-viewing partial structural diagram illustrating an LED bracket array in an embodiment of the present invention. FIG. 11 is a bottom-viewing partial structural diagram illustrating an LED bracket array in an embodiment of the present invention. The LED bracket array 3 provided in embodiments of the present invention includes a plurality of LED brackets 2 arranged in an array and mutually connected. The LED brackets 2 are the LED brackets 2 described in any one of above embodiments. The side electrode regions 202 of every four adjacent LED brackets 2 in the LED bracket array 3 enclose a via hole 30. The insulating material 21 is filled in the via hole 30.

In a manufacturing technology of the LED device, after the processes of die bonding, wire bonding and encapsulation, a plurality of discrete LED devices are formed after the LED bracket array 3 in the present embodiment is cut along the via hole 30 transversely and longitudinally in the process of dicing chip. Embodiments of the present invention provide the LED bracket array 3 including the LED brackets 2, so as to benefit the increase of the product qualification ratio and the production efficiency for manufacturing the LED device and ensure reliability and use effect of the LED device.

Figure 12:
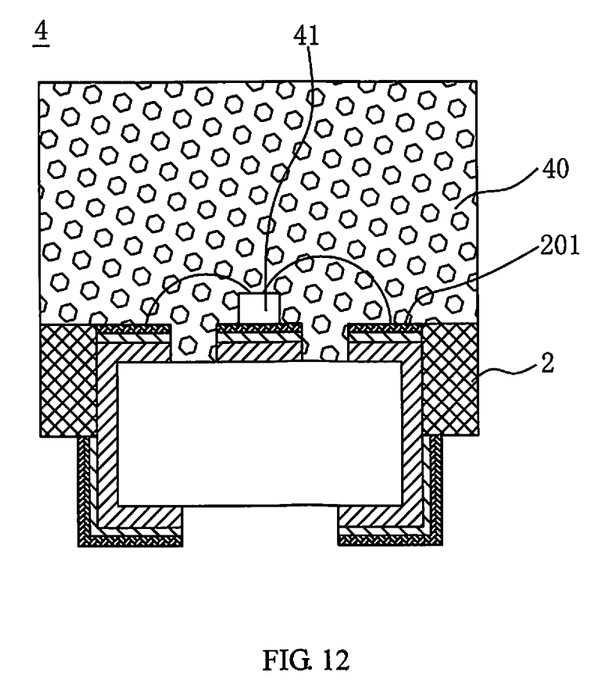
FIG. 12 is a side-viewing diagram illustrating an LED device in an embodiment of the present invention.
Figure 13:
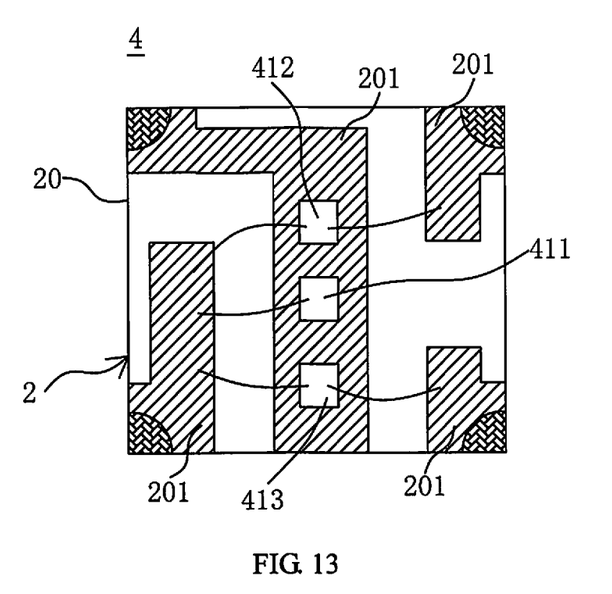
FIG. 13 is a top-viewing diagram illustrating an LED device in an embodiment of the present invention.

FIG. 12 is a side-viewing diagram illustrating an LED device in an embodiment of the present invention. FIG. 13 is a top-viewing diagram illustrating an LED device in an embodiment of the present invention. The LED device 4 provided in embodiments of the present invention includes an LED bracket 2, an LED chip 41 and an encapsulation adhesive layer 40. The LED chip 41 is arranged on the LED bracket 2 and coated with encapsulation adhesive layer 40.

In the present embodiment, the LED device 4 is a full-color LED device 4. The LED bracket 2 is the LED bracket 2 described in any one of above embodiments, and is beneficial for ensuring the reliability and the application effect of the LED device 4. Three top electrode regions 201 in the LED device 4 as three wire bonding parts are respectively arranged at three corners of the PCB circuit substrate 20; and the rest top electrode region 201 as a chip mounting part is arranged in the middle of the PCB circuit substrate 20 and extends to another corner of the PCB circuit substrate 20. The chip mounting part and the three wire bonding parts are electrically insulated from each other.

The LED chip 41 includes a red-light LED chip 411, a green-light LED chip 412 and a blue-light LED chip 413. The red-light LED chip 411, the green-light LED chip 412 and the blue-light LED chip 413 are arranged on the chip mounting part of the LED bracket 2, and are respectively electrically connected to the three bonding wires through leading wires.

The encapsulation adhesive layer 40 is a transparent encapsulation adhesive layer.

In the practical manufacturing technology of the LED device 4, the LED device 4 in the present embodiment is formed after the LED bracket array 3 is subjected to the processes of die bonding, wire bonding, encapsulation and dicing chip.

The LED device 4 in embodiments of the present invention may have a variety of variants. For example, the LED device 4 may be a single-color device or dual-color device. The LED chip 41 of the LED device 4 is a single-color LED chip or two LED chip with two different colors. The LED bracket 2 of the LED device 4 includes one chip mounting part and one wire bonding part, or includes one chip mounting part and two wire bonding parts, or includes three chip mounting parts and three wire bonding parts, and the like.

Figure 14:
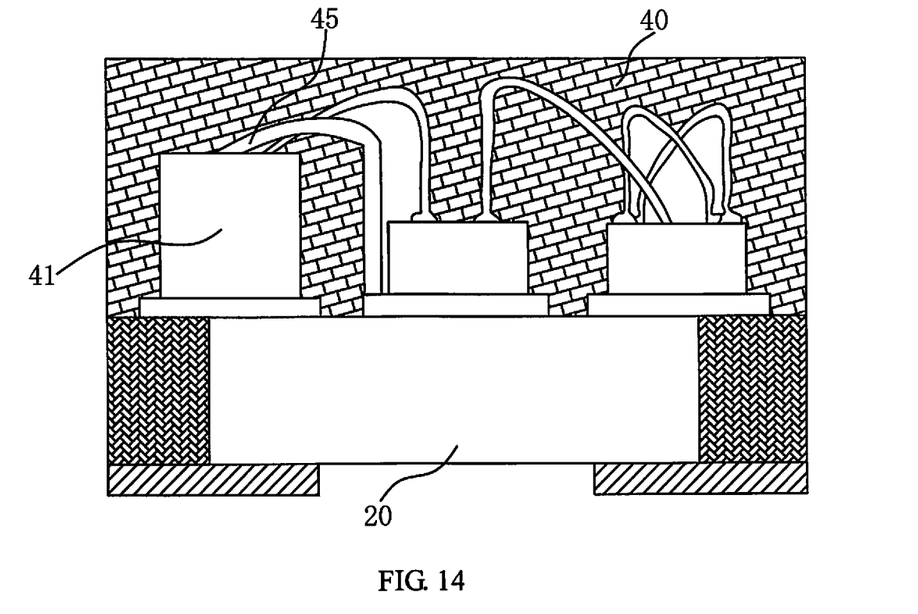
FIG. 14 is a side-viewing diagram illustrating another LED device in an embodiment of the present invention.

FIG. 14 is a side-viewing diagram illustrating another LED device in an embodiment of the present invention. The LED device 4 includes at least one LED chip 41, a PCB circuit substrate 20 for supporting the LED chip 41, a bonding wire 45 for connecting the electrodes of the LED chip 41 and the PCB circuit substrate 20, and an encapsulation adhesive layer 40 for covering the LED chip 41 and the bonding wire 45. The LED chip 41 is welded on a wire bonding region through the bonding wire 45.

In the present embodiment, the LED device includes three LED chips, i.e., a red-light LED chip, a green-light LED chip and a blue-light LED chip.

Figure 15:
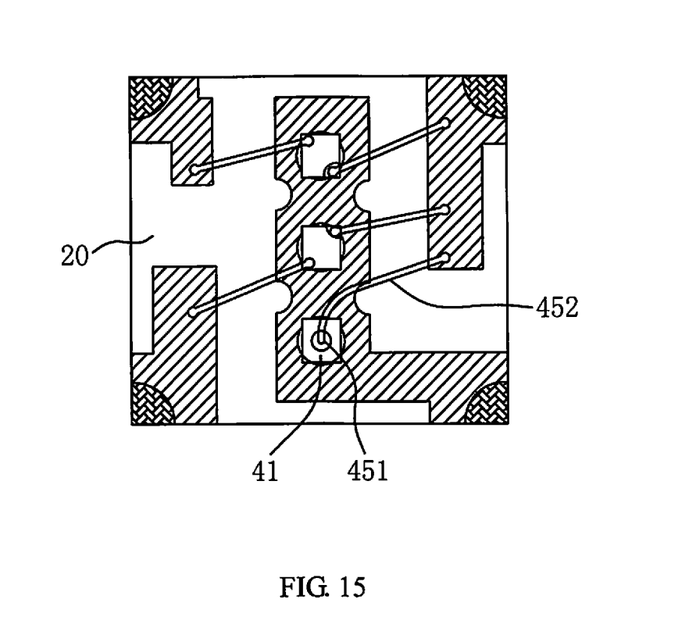
FIG. 15 is a top-viewing diagram illustrating another LED device in an embodiment of the present invention.

FIG. 15 is a top-viewing diagram illustrating another LED device in an embodiment of the present invention. With reference to FIG. 15, the bonding wire 45 in embodiments of the present invention includes a straight part 451 and a curve part 452 connected with the straight part 451. A projection of the curve part 452 in a horizontal plane is a curve. The projection of the curve part 452 has an arc shape or S shape, but not limited to this. One end of the straight part 451 is connected with the LED chip 41, and the other end of the straight part 451 is connected with one end of the curve part 452. The other end of the curve part 452 is welded on the wire bonding region of the PCB circuit substrate 20.

In embodiments of the present invention, a vertical height of a highest point on the top of the bonding wire 45 relative to a top surface of the PCB circuit substrate 20 is less than or equal to 200 μm. A height of the straight part 451 of the bonding wire 45 is 15 μm to 60 μm. Namely, the vertical height from the top of the LED chip 41 to the straight part 451 of the bonding wire 45 is 15 μm to 60 μm.

Figure 16:
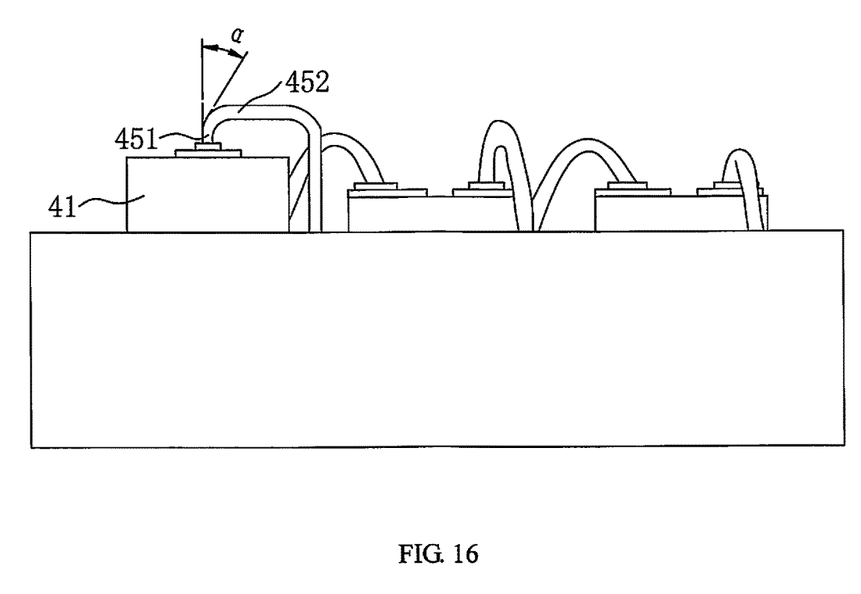
FIG. 16 is a side-viewing diagram illustrating another LED device in an embodiment of the present invention.

FIG. 16 is a side-viewing diagram illustrating another LED device in an embodiment of the present invention. An included angle a between one end of the curve part 452 connected to the straight part 451 and a perpendicular of the top electrode surface of the LED chip 41 is within 0° to 45°.

The length of the PCB circuit substrate 20 is 1.0 mm and the width of the PCB circuit substrate 20 is 1.0 mm. The PCB circuit substrate 20 is a black BT substrate or FR4 substrate. The PCB circuit substrate 20 can also be an ordinary PCB or TOP-LED bracket. When the PCB circuit substrate 20 is the black BT substrate, a light contrast of the LED device can be greatly enhanced.

The LED device is a single-color device, a dual-color device, a full-color device or a white device. When the LED device is an LED device emitting white light, the LED chip is a blue-light chip, and the encapsulation adhesive layer is mixed with yellow fluorescent powder. When the LED device is a single-color LED device, the LED chip may be in any color. For example, the LED chip is any one of a red-light LED chip, an orange-light LED chip, a yellow-light LED chip, a green-light LED chip and a blue-light LED chip. The color of the LED chip is not limited to the colors provided by the present embodiment. The encapsulation adhesive layer is a transparent encapsulation adhesive layer. When the LED device is the dual-color device, the LED chip is a combination of any two colors of LED chips above, and the encapsulation adhesive layer is a transparent encapsulation adhesive layer. When the LED device is the full-color device, the LED chip is a combination of the red-light LED chip, the green-light LED chip and the blue-light LED chip, and the encapsulation adhesive layer is a transparent encapsulation adhesive layer.

When the LED device at least includes one red-light LED chip, since the height of the red-light LED chip is relatively high, the bonding wire of the red-light LED chip employs the bonding wire structure in the present embodiment, while bonding wire structures of other LED chips are not limited and may employ the bonding wire structure in the present embodiment or other bonding wire structures. In an embodiment, when the LED device is the full-color device, the bonding wires of the red-light LED chip adopt the bonding wire structure in the present embodiment, and other LED chips adopt ordinary bonding wire structures. At this moment, the size of the LED device may be 1.0 mm×1.0 mm.

In the present embodiment, by taking positive wire bonding as an example, fabrication of the LED device includes steps S1 to S3.

At S1: a LED chip 41 is fixed to a top of a PCB circuit substrate 20.

At S2: the LED chip 41 is welded and connected to a wire bonding region of the PCB circuit substrate 20. A bonding wire includes a straight part 451 and a curve part 452 connected with the straight part 451. A projection of the curve part 452 in a horizontal plane is a curve. The other end of the straight line part 451 is welded to the top electrode of the LED chip 41, and the other end of the curve part 452 is welded on the wire bonding region of the PCB circuit substrate 20. Specifically, one end of a gold wire is welded on the top electrode of the LED chip 41 by a wire bonder; and then, after a welding head is upwards lifted away from the top electrode of the LED chip 41, the other end of the gold wire is welded on the wire bonding region of the PCB circuit substrate 20 with the gold wire being arranged in a curve.

At S3: an encapsulation adhesive is formed on the top of the PCB circuit substrate 20 to form an encapsulation adhesive layer 40; and the encapsulation adhesive layer 40 clads the LED chip 41 and the bonding wire 45 to obtain the LED device.

The LED device in embodiments of the present invention employs such a bonding wire structure that the projection of the curve part 452 in the horizontal plane is the curve, thereby reducing the height of the bonding wire 45, avoiding defects of the LED device due to pressing on the electrode in subsequent processing, enhancing product quality of the LED device and prolonging service life. Moreover, the bonding wire structure of the LED device is simple in technology and convenient in operation.

Embodiments of the present invention further provide an LED display screen. The display screen includes a plurality of LED devices 4, a PCB and a mask. The LED devices are the LED devices described in any one of above embodiments, and mounted and electrically connected to the PCB. The mask is placed above the PCB and buckled with the PCB. The LED devices are used for fabricating the display screen, the LED chip adopts a curve bonding wire structure, thereby avoiding pressing and damaging the electrode in subsequent processing due to too high bonding wire, further avoiding product defects of the LED devices and enhancing quality and service life of the LED display screen.

In illustration of the description, the reference terms such as "an embodiment", "an example" and the like means that specific features, structures, materials or characteristics illustrated by combining with the embodiment or the example are included in at least one embodiment or example of the present invention. In the description, schematic expression of the above terms does not necessarily refer to the same embodiment or example. Moreover, the illustrated specific features, structures, materials or characteristics can be combined in any one or more embodiments or examples in a proper manner.

What is claimed is:

1. A light emitting diode (LED) bracket, comprising a Printed Circuit Board (PCB) circuit substrate and an insulating material, wherein the PCB circuit substrate comprises at least two electrode regions electrically insulated from each other; each of the at least two electrode regions comprises a top electrode region, a side electrode region and a bottom electrode region; the top electrode region and the bottom electrode region are connected into an integrated structure by the side electrode region; the side electrode region is a side surface sunk from an outside to an interior of the PCB circuit substrate; the side electrode region is partially coated by the insulating material; an upper end surface and a lower end surface of the insulating material do not exceed an upper surface and a lower surface of the PCB circuit substrate in a thickness direction thereof, and a thickness h of the insulating material is less than a thickness H of the PCB circuit substrate.

2. The LED bracket according to claim 1, wherein the upper end surface of the insulating material is at a same level with the upper surface of the PCB circuit substrate; or
the upper end surface and the lower end surface of the insulating material are configured to be located between the upper surface and the lower surface of the PCB circuit substrate.

3. The LED bracket according to claim 1, wherein the thickness h of the insulating material and the thickness H of the PCB circuit substrate satisfy a relational expression:

$$\frac{1}{2}H \le h \le \frac{2}{3}H.$$

4. The LED bracket according to claim 1, wherein each of the top electrode region, the side electrode region and the bottom electrode region is respectively provided with a metal layer; and the metal layer of the top electrode region, the metal layer of the side electrode region and the metal layer of the bottom electrode region are connected into an integrated structure.

5. The LED bracket according to claim 4, wherein the top electrode region is provided with a first gold layer, a first nickel layer and a first copper layer from top to bottom; the side electrode region is provided with a second gold layer, a second nickel layer and a second copper layer from the outside to the PCB circuit substrate; the bottom electrode region is provided with a third gold layer, a third nickel layer and a third copper layer from bottom to top;
the first copper layer of the top electrode region, the second copper layer of the side electrode region and the third copper layer of the bottom electrode region are connected into a first integrated structure; and
the second gold layer of the side electrode region and the third gold layer of the bottom electrode region are connected into a second integrated structure, and the second nickel layer of the side electrode region and the third nickel layer of the bottom electrode region are connected into a third integrated structure; or, the second gold layer of the side electrode region and the first gold layer of the top electrode region are connected into a fourth integrated structure, and the second nickel layer of the side electrode region and the first nickel layer of the top electrode region are connected into a fifth integrated structure.

6. The LED bracket according to claim 5, wherein a thickness d3 of the second copper layer of the side electrode region is d3≥10 μm, a thickness d2 of the second nickel layer is d2≥2.5 μm, and a thickness d1 of the second gold layer is d1≥0.1 μm.

7. The LED bracket according to claim 4, wherein the top electrode region is provided with a first gold layer, a first silver layer, a first nickel layer and a first copper layer from top to bottom; the side electrode region is provided with a second gold layer, a second silver layer, a second nickel layer and a second copper layer from the outside to the PCB circuit substrate; the bottom electrode region is provided with a third gold layer, a third silver layer, a third nickel layer and a third copper layer from bottom to top;
the first copper layer of the top electrode region, the second copper layer of the side electrode region and the third copper layer of the bottom electrode region are connected into a first integrated structure; and
the second gold layer of the side electrode region and the third gold layer of the bottom electrode region are connected into a second integrated structure, the second silver layer of the side electrode region and the third silver layer of the bottom electrode region are connected into a sixth integrated structure, and the second nickel layer of the side electrode region and the third nickel layer of the bottom electrode region are connected into a third integrated structure; or, the second gold layer of the side electrode region and the first gold layer of the top electrode region are connected into a fourth integrated structure, the second silver layer of the side electrode region and the first silver layer of the top electrode region are connected into a seventh integrated structure, and the second nickel layer of the side electrode region and the first nickel layer of the top electrode region are connected into a fifth integrated structure.

8. The LED bracket according to claim 7, wherein a thickness d3 of the second copper layer of the side electrode region is d3≥10 μm, a thickness d2 of the second nickel layer is d2≥2.5 μm, a thickness d4 of the second silver layer is d4≥0.25 pm, and a thickness d1 of the second gold layer is d1≥0.1 μm.

9. The LED bracket according to claim 4, wherein the top electrode region is provided with a first gold layer, a first palladium layer, a first nickel layer and a first copper layer from top to bottom; the side electrode region is provided with a second gold layer, a second palladium layer, a second nickel layer and a second copper layer from the outside to the PCB circuit substrate; the bottom electrode region is provided with a third gold layer, a third palladium layer, a third nickel layer and a third copper layer from bottom to top;
the first copper layer of the top electrode region, the second copper layer of the side electrode region and the third copper layer of the bottom electrode region are connected into a first integrated structure; and
the second gold layer of the side electrode region and the third gold layer of the bottom electrode region are connected into a second integrated structure, the second palladium layer of the side electrode region and the third palladium layer of the bottom electrode region are connected into an eighth integrated structure, and the second nickel layer of the side electrode region and the third nickel layer of the bottom electrode region are connected into a third integrated structure; or, the second gold layer of the side electrode region and the first gold layer of the top electrode region are connected into a fourth integrated structure, the second palladium layer of the side electrode region and the first palladium layer of the top electrode region are connected into a ninth integrated structure, and the second nickel layer of the side electrode region and the first nickel layer of the top electrode region are connected into a fifth integrated structure.

10. The LED bracket according to claim 9, wherein a thickness d3 of the second copper layer of the side electrode region is d3≥10 μm, a thickness d2 of the second nickel layer is d2≥2.5 μm, a thickness d5 of the second palladium layer is d5≥0.1 μm, and a thickness d1 of the second gold layer is d1≥0.1 μm.

11. The LED bracket according to claim 1, wherein the insulating material is resin or green oil.

12. A light emitting diode (LED) bracket array, comprising a plurality of LED brackets, wherein each of the plurality of LED brackets comprises a Printed Circuit Board (PCB) circuit substrate and an insulating material, wherein the PCB circuit substrate comprises at least two electrode regions electrically insulated from each other; each of the at least two electrode regions comprises a top electrode region, a side electrode region and a bottom electrode region; the top electrode region and the bottom electrode region are connected into an integrated structure by the side electrode region; the side electrode region is a side surface sunk from an outside to an interior of the PCB circuit substrate; the side electrode region is partially coated by the insulating material; an upper end surface and a lower end surface of the insulating material do not exceed an upper surface and a lower surface of the PCB circuit substrate in a thickness direction thereof, and a thickness h of the insulating material is less than a thickness H of the PCB circuit substrate.

13. The LED bracket array according to claim 12, wherein the PCB circuit substrate comprises four electrically insulated electrode regions; and the side electrode regions of every four adjacent LED brackets enclose a via hole.

* * * * *